US008766436B2

(12) United States Patent
DeLucca et al.

(10) Patent No.: US 8,766,436 B2
(45) Date of Patent: Jul. 1, 2014

(54) MOISTURE BARRIER FOR A WIRE BOND

(75) Inventors: John M. DeLucca, Wayne, PA (US);
Frank A. Baiocchi, Allentown, PA (US);
Ronald J. Weachock, Pottsville, PA (US); John W. Osenbach, Kutztown, PA (US); Barry J. Dutt, Pen Argyl, PA (US)

(73) Assignee: LSI Corporation, Milpitas, CA (US)

( * ) Notice: Subject to any disclaimer, the term of this patent is extended or adjusted under 35 U.S.C. 154(b) by 114 days.

(21) Appl. No.: 13/037,836

(22) Filed: Mar. 1, 2011

(65) Prior Publication Data

US 2012/0223432 A1    Sep. 6, 2012

(51) Int. Cl.
*H01L 23/485*    (2006.01)
(52) U.S. Cl.
USPC ............... 257/737; 257/E23.021; 257/787
(58) Field of Classification Search
USPC ......... 257/673, 690, 701, 759, 760, 784, 787, 257/790, 795, E23.133, E23.131, E23.126, 257/E23.021–E23.026, 737, 747, 762–766
See application file for complete search history.

(56) References Cited

U.S. PATENT DOCUMENTS

| | | | |
|---|---|---|---|
| 6,191,492 B1 * | 2/2001 | Yamazaki et al. | 257/787 |
| 7,662,722 B2 * | 2/2010 | Stamper et al. | 438/719 |
| 8,399,350 B2 * | 3/2013 | Nogami et al. | 438/619 |
| 2003/0052339 A1 * | 3/2003 | Harada et al. | 257/200 |
| 2005/0014356 A1 * | 1/2005 | Pozder et al. | 438/614 |
| 2007/0278634 A1 | 12/2007 | Cho et al. | |
| 2009/0155993 A1 * | 6/2009 | Coolbaugh et al. | 438/613 |

OTHER PUBLICATIONS

Jo, Myung-Chan, et al., "A Study on the Feasibility of Silicon Nitride Thin Film as Diffusion Barriers over IC Chip Packaging"; J. Ind. Eng. Chem., vol. 8, No. 5, 2002, pp. 458-463.
Kishimoto, Akira, et al., "Diffusion Coefficients for Amorphous Polymer and Water Systems"; vol. 33, No. 7, pp. 988-992.
Ulrich, Richard K., et al., "PECVD Silicon Nitride Postbond Films for Protecting Bondpads, Bonds and Bondwires for Corrosion Failure"; IEEE, May 11-16, 1991, pp. 738-744.
Uno, Tomohiro, et al,; "Improving Humidity Bond Reliability of Copper Bonding Wires"; 2010 Electronic Components and Technology Conference, IEEE, pp. 1725-1732.
Shimaya, Masakazu; "Water Diffusion Model for the Enhancement of Hot-Carrier-Induced Degradation Due to Silicon Nitride Passivation in Submicron MOSFETS"; Apr. 4-6, 1995, IEEE, pp. 292-296.
Uno, Tomohiro; "Bond reliability under humid environment for coated copper wire and bare copper wire—Abstract", Sciencedirect. com, Nov. 18, 2010, 1 page.

* cited by examiner

*Primary Examiner* — Matthew W Such
*Assistant Examiner* — Ali Naraghi

(57) ABSTRACT

An electronic device comprising a bond pad on a substrate and a wire bonded to the bond pad. The device further comprises an intermetallic compound interface located between the bond pad and the wire and a silicon nitride or silicon carbonyl layer covering the intermetallic compound interface.

17 Claims, 3 Drawing Sheets

FIG. 2

MOISTURE BARRIER FOR A WIRE BOND

TECHNICAL FIELD

This application is directed, in general, to electronic packaging, and more specifically to wire bonding in integrated circuit packages.

BACKGROUND

Despite being encapsulated in polymeric mold compounds, the wire bonds in electronic packages can be subject to accelerated degradation in high temperature and humid environments, thereby decreasing device reliability.

SUMMARY

One embodiment of the disclosure is an electronic device. The electronic device comprises a bond pad on a substrate and a wire bonded to the bond pad. The device further comprises an intermetallic compound interface located between the bond pad and the wire and a silicon nitride or silicon carbonyl layer covering the intermetallic compound interface.

Another embodiment of the disclosure is method of manufacturing an electronic device that comprises forming a wire bond. Forming the wire bond includes providing a bond pad on a substrate and bonding a wire to the bond pad, thereby forming an intermetallic compound interface. The method also comprises forming a silicon nitride or silicon carbonyl layer that covers an outer surface of the intermetallic compound interface.

BRIEF DESCRIPTION OF THE DRAWINGS

Reference is now made to the following descriptions taken in conjunction with the accompanying drawings, in which.

DETAILED DESCRIPTION

For the purposes of the present disclosure, the term, "or," as used herein, refers to a non-exclusive or, unless otherwise indicated.

As part of the present disclosure, it was recognized that layers of silicon nitride or silicon carbonyl have superior moisture penetration resistance properties as compared to polymeric mold compounds. Although often used in the fabrication of integrated circuit components, is it unusual to employ silicon nitride and silicon carbonyls at the circuit packaging level. The use of silicon nitrides or silicon carbonyls to prevent the penetration of contaminants, such as chorine, alkali ions or acids, during the fabrication of electronic devices is different from their use as a water barrier for wire bonds as disclosed herein.

It was also recognized, as part of the present disclosure, that certain physical properties of silicon nitrides or silicon carbonyls make them surprisingly good moisture barriers for wire bonds. In particular, silicon nitrides or silicon carbonyls have several orders-of-magnitude lower water diffusion coefficients compared to the commonly used polymeric mold compounds. Additionally, silicon nitrides or silicon carbonyls have the ability to form strong bonds to the metals (e.g., copper, gold, aluminum or their metal oxide coated surfaces) often used in wire bonding.

It was further recognized, as part of the present disclosure, that covering the weak mechanical link in a wire bond with silicon nitride or silicon carbonyl layers can substantially enhance the reliability of wire bonds exposed to conditions of high temperature and humidity. It was discovered that moisture promotes wire bond degradation primarily due to oxidation at an intermetallic compound interface located between a bond pad and wire. It was further discovered that forming silicon nitride or silicon carbonyl layers on the intermetallic compound interface substantially increases the wire bond's resistance to such degradation.

Figure 1:
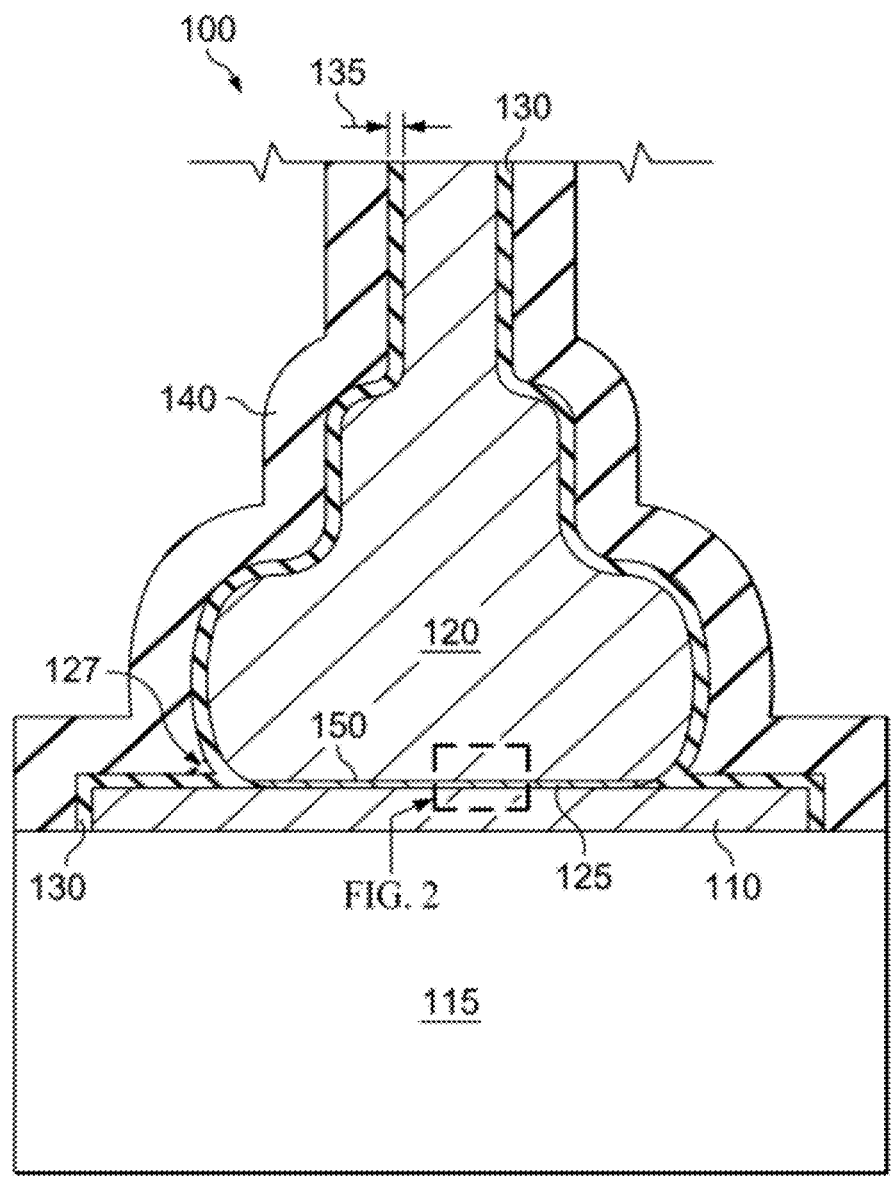
FIG. 1 illustrates a cross-sectional view of an example electronic device of the present disclosure.
Figure 2:
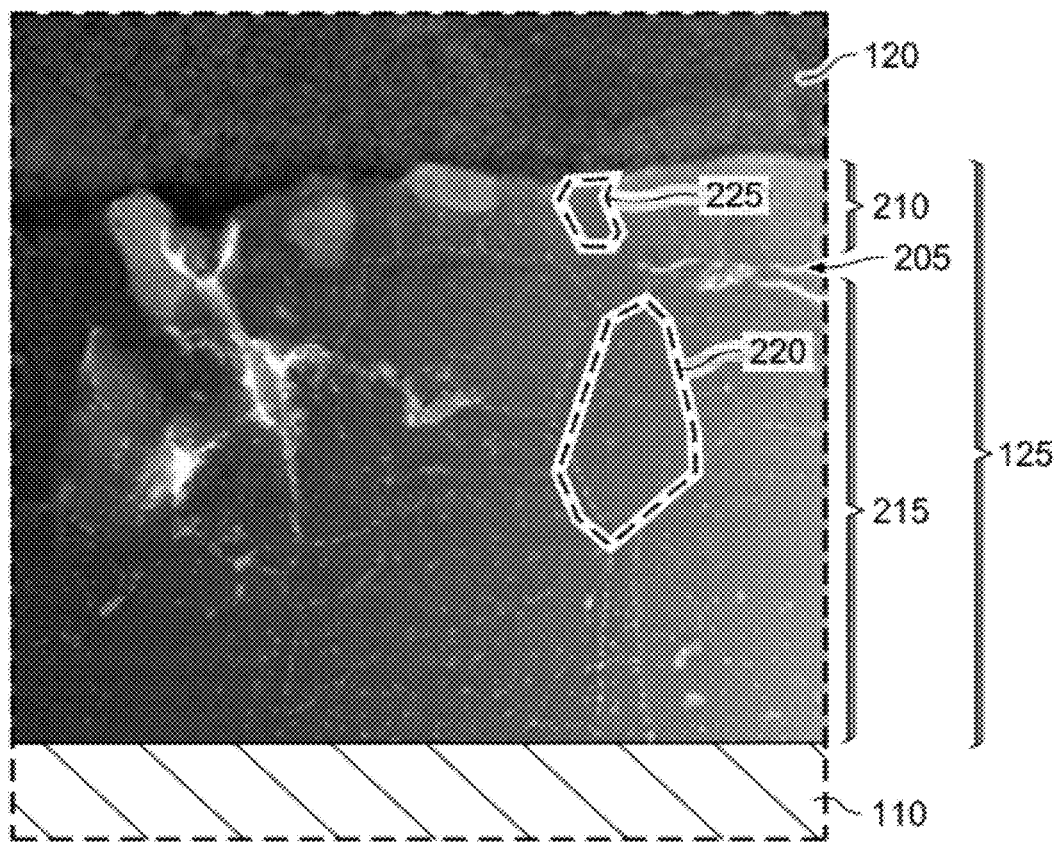
FIG. 2 shows a detail view of the example electronic device corresponding to view 2 shown in FIG. 1.

One embodiment of the disclosure is an electrical device. FIG. 1 illustrates a cross-sectional view of an example electrical device 100 of the present disclosure. Example embodiments of the device 100 include integrated circuit packages. FIG. 2 shows a detail view of the example device 100, corresponding to view 2 shown in FIG. 1 after exposing the device to high temperature and humidity conditions. One of ordinary skill in the art would understand how techniques such as Transmission electron microscopy analysis, or scanning electron microscopy analysis could be used to produce detailed view images such as depicted in FIG. 2.

As shown in FIG. 1, the device 100 comprises a bond pad 110 on a substrate 115, a wire 120 bonded to the bond pad 110 and an intermetallic compound interface 125 located between the bond pad 110 and the wire 120. The device 100 further comprises a silicon nitride or silicon carbonyl layer 130 covering the intermetallic compound interface 125.

Example embodiments of the substrate 115 include wafer substrates composed of silicon or other semiconductor materials, substrate dies, package substrates, or interposer substrates. The terms silicon nitride and silicon carbonyl layers refer to material layers having a elemental formulas of $Si_3N_4$ and $Si(CO)_n$ (n=1-4), respectively. The term intermetallic compound as used herein refers to a solid phase material containing two or more metallic elements, with optionally one or more non-metallic elements, whose crystal structure differs from that of the other constituents (e.g., the metal bond pad and metal wire as well as other intermetallic compounds). As well known to those skilled in the art, intermetallic compounds are brittle and exhibit high melting temperatures (e.g., frequently greater than one of their pure elemental constituent phases).

The intermetallic compound interface 125 can be part of any number of different types of wire bonds 127 typically formed in the semiconductor industry. In some embodiments, for example, the intermetallic compound interface layer 125 is part of a ball bond, while in other embodiment the intermetallic compound interface 125 is part of a wedge bond.

In some embodiments, the silicon nitride or silicon carbonyl layer 130 has a sufficient thickness 135 to qualify the device 100 to a standardized reliability testing condition, referred to herein as Highly Accelerated Stress Testing (HAST). In some cases, for instance, the minimum thickness 135 is sufficient to deter water diffusion under the HAST conditions of 96 hrs at 130° C. and 85% relative humidity, as indicated by the absence of oxide formation in the intermetallic compound interface 125 (e.g., the absence of cubic crystal lattice structures in the interface 125 corresponding to metal oxides such aluminum oxide). For example, in some embodiments, the silicon nitride or silicon carbonyl layer 130 has a thickness 135 (e.g., average thickness) in a range from about 10 nm to 5000 nm. For example, in some preferred embodiments, the silicon nitride layer 130 has a minimum thickness 135 of at least about 100 nm, and in some cases, at least about 200 nm. For instance, in some embodiments, a 200 nm thick 135 silicon nitride layer 130 can provide a moisture barrier that is equivalent to a 1 mm or greater thickness of a polymeric mold compound, and therefore, there is no need to take further steps to include a polymeric mold.

In other embodiments, however, the device 100 further includes a polymeric mold layer 140 on the silicon nitride or silicon carbonyl layer 130. The polymeric mold layer 140 can provide additional moisture resistance, or, permit a smaller thickness 135 of the silicon nitride or silicon carbonyl layer 130 to be used while still qualifying the device 100 under the certain HAST conditions. One of ordinary skill would be familiar with the types of polymeric mold compounds that are typically used as a moisture barrier in electronic devices 100. Non-limiting examples of suitable polymeric mold compounds include silicone rubber, epoxy resins or thermoplastics.

As further illustrated in FIG. 2, in some embodiments of the device 100, the weakest mechanical link can form at the interface 205 between two morphologically distinct intermetallic compound layers 210, 215 within the intermetallic compound interface 125. The example device 100, comprising an aluminum bond pad 110 and a gold wire 120 is depicted in FIG. 2 after exposure to HAST conditions of 175° C. and 85% relative humidity for 75 hours. Thereafter, dark field STEM images such as shown in FIG. 2 were obtained from the intermetallic compound interface 125.

As shown in FIG. 2, the intermetallic compound interface 125 can include a first intermetallic compound layer 210 that is adjacent to the wire 120, and a second intermetallic compound layer 215 that is adjacent to the bond pad 110. In some cases the second intermetallic compound layer 215 has a larger average grain 220 size than a grain 225 size of the first intermetallic compound layer 210. For example, in some cases the grains 220 in the first intermetallic compound layer 210 are on average at least about 10 percent, and in some cases, at least about 50 percent, and still other cases, at least about 200 percent or greater in size that the grains 225 of the second intermetallic compound layer 215. One of ordinary skill would be familiar with standard metallurgic methods to quantify the average grain size of intermetallic compounds, for example, by estimating the cross sectional area or volume of the grains 220, 225.

In some embodiments, the first and second intermetallic compound layers 210, 215 are composed of a first metal of the wire 120 (e.g., gold, copper or alloys thereof) and a second metal of the bond pad 110 (e.g., aluminum or aluminum alloys) and a first metal to second metal atomic ratio of the first intermetallic compound layer 210 is greater than a first metal to second metal atomic ratio of the second intermetallic compound layer 215. For instance, in some cases, the first metal to second metal atomic ratio of the first intermetallic compound layer 210 equals about 4:1 and the first metal to second metal atomic ratio of the second intermetallic compound layer 215 equals about 8:3. For example, when the wire 120 is composed of gold and the bond pad is composed of aluminum, the first intermetallic compound layer 210 can have a Au:Al ratio of 4:1 (e.g., $Au_4Al$) and the second intermetallic compound layer 215 can have a Au:Al ratio of 8:3 (e.g., $Au_8Al_3$). In other cases, when the wire 120 is composed of copper and the bond pad is composed of aluminum, the first intermetallic compound layer 210 can have a Cu:Al ratio that is greater than a Cu:Al ratio of the second intermetallic compound layer 215.

As part of the present disclosure, it was discovered that in some cases the intermetallic-intermetallic interface 205 can be the location where moisture-promoted oxidation occurs most prominently and thereby weakens the wire bond 127. Consequently, breakage of the wire bond 127 most likely occurs at the intermetallic-intermetallic interface 205. Therefore, in some preferred embodiments, the silicon nitride or silicon carbonyl layer 130 preferably covers the intermetallic-intermetallic interface 205.

Figure 3:
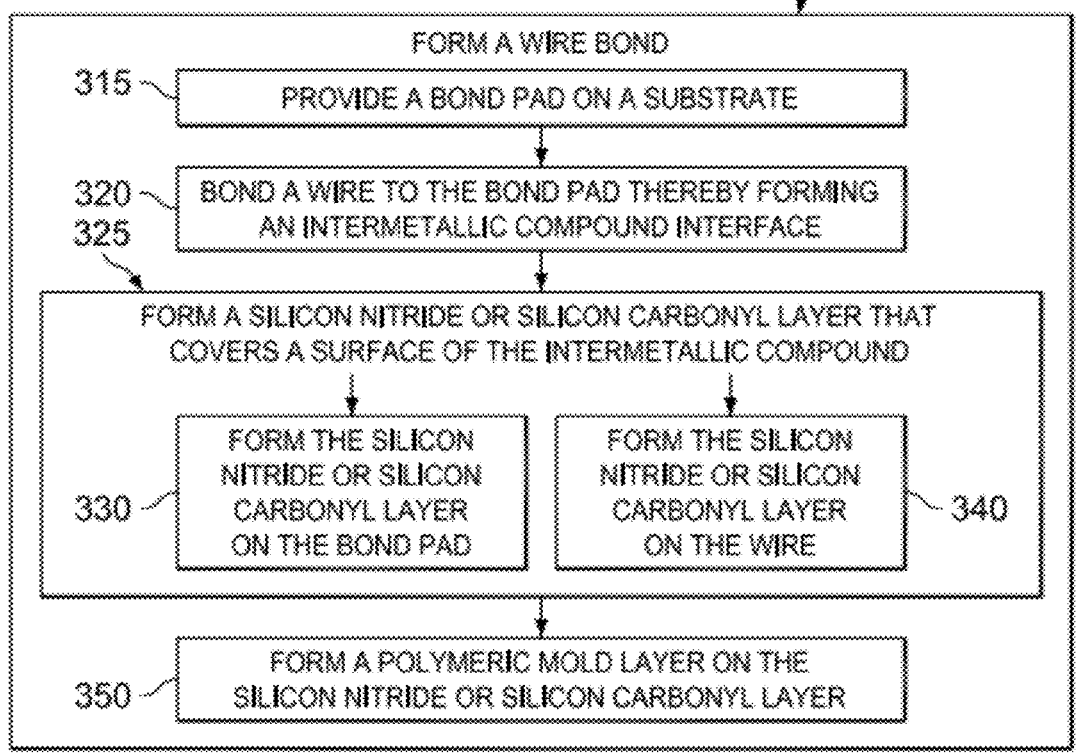
FIG. 3 presents a flow diagram of an example method of manufacturing an electronic device of the disclosure, such as any of the example devices discussed in the context of FIGS. 1 and 2.

Another embodiment of the disclosure is a method of manufacturing an electronic device. FIG. 3 presents a flow diagram illustrating selective steps in an example embodiment of a method 300 of manufacturing the device, such as any of the device discussed above in the contexts of FIGS. 1-2.

With continuing reference to FIGS. 1-2 throughout, as illustrated in FIG. 3, the method 300 comprises a step 310 of forming a wire bond 127 for the electronic device 100. Forming the wire bond 127 in step 310 includes a step 315 of providing a bond pad 110 on a substrate 115 and step 320 of bonding a wire 120 to the bond pad 110, thereby forming an intermetallic compound interface 125. The method 300 also comprises a step 325 of forming a silicon nitride or silicon carbonyl layer 130 that covers a surface 150 (FIG. 1) of the intermetallic compound interface 125. For example, in some cases the silicon nitride layer or silicon carbonyl layer formed in step 325 has a thickness in a range from about 10 nm to 5000 nm, and in some preferred embodiments, a minimum thickness of at least about 100 nm and more preferably at least about 200 nm.

In some cases, as part of step 325 the formed silicon nitride or silicon carbonyl layer 130 covers the entire outer surface 150 of the intermetallic compound interface 125. In still other cases, forming the silicon nitride or silicon carbonyl layer 130 in step 325 further includes a step 330 of forming the silicon nitride or silicon carbonyl layer 130 on the bond pad 110, or, a step 340 of forming the silicon nitride or silicon carbonyl layer 130 on the wire 120, or both steps 330, 340. Forming the silicon nitride or silicon carbonyl layer 130 in accordance with steps 330 or 340 (or both) can beneficially improve the corrosion resistance of the bond pad 110 or wire 120, such as when the bond pad 110 or wire 120 are composed of a metal that is sensitive to oxidation (e.g., a copper wire) or exposed to harsh environments (e.g., acidic solutions) that the device 100 may be exposed to during its fabrication, testing or end use.

In some embodiments, forming the silicon nitride layer or silicon carbonyl layer 130 in step 325 includes a chemical vapor deposition process. In some cases, it is advantageous for the chemical vapor deposition process to be carried out at a low temperature (e.g., a temperature in a range from about 100° C. to 150° C.) because oxidation of the intermetallic compound interface 125 can be undesirably accelerated at higher temperatures.

In some cases, bonding the wire 120 to the bond pad 110 (step 320) includes ball bonding or wedge bonding. One of ordinary skill would be familiar with ball bonding or wedge bonding processes, such as ultrasonic or thermosonic wedge bonding.

As further illustrated in FIG. 3, some embodiments of the method 300 further include including a step 350 forming a polymeric mold layer 140 on the silicon nitride or silicon carbonyl layer 130. One of ordinary skill would be familiar with processes, such as injection molding, to encapsulate the electronic devices in polymeric mold. As part of step 350 the polymeric mold layer 140 preferably covers the silicon nitride or silicon carbonyl layer 130 on the intermetallic compound interface 125, but in some embodiments can also cover the bond pad 110, the wire 120, or both.

Those skilled in the art to which this application relates will appreciate that other and further additions, deletions, substitutions and modifications may be made to the described embodiments.

What is claimed is:

1. An electronic device, comprising:
   a bond pad on a substrate;
   a wire bonded to the bond pad;
   an intermetallic compound interface located between the bond pad and the wire; and
   a silicon nitride or silicon carbonyl layer covering the intermetallic compound interface wherein:
   the silicon carbonyl layer has an elemental formula of $Si(CO)_n$ (n=1-4), and
   the intermetallic compound interface includes a first intermetallic compound layer that is adjacent to the wire, and a second intermetallic compound layer that is adjacent to the bond pad, wherein the second intermetallic compound layer has a larger average grain size than the first intermetallic compound layer.

2. The device of claim 1, wherein the intermetallic compound interface is part of a ball bond.

3. The device of claim 1, wherein the intermetallic compound interface is part of a wedge bond.

4. The device of claim 1, wherein the silicon nitride layer or silicon carbonyl layer has a thickness in a range from about 10 nm to 5000 nm.

5. The device of claim 1, wherein the silicon nitride layer has a minimum thickness of at least about 200 nm.

6. The device of claim 1, further including a polymeric mold layer on the silicon nitride or silicon carbonyl layer.

7. The device of claim 1, wherein the first and second intermetallic compound layers are composed of a first metal of the wire and a second metal of the bond pad, wherein a first metal to second metal atomic ratio of the first intermetallic compound layer is greater than a first metal to second metal atomic ratio of the second intermetallic compound layer.

8. The device of claim 7, wherein the first metal to second metal atomic ratio of the first intermetallic compound layer equals about 4:1 and the first metal to second metal atomic ratio of the second intermetallic compound layer equals about 8:3.

9. The device of claim 1, wherein the wire is composed of gold, copper, or alloys thereof.

10. The device of claim 1, wherein the bond pad is composed of aluminum or an aluminum alloy.

11. The device of claim 1, wherein the intermetallic compound interface includes first and second gold-aluminum intermetallic layers.

12. The device of claim 1, wherein the silicon nitride or silicon carbonyl layer that covers the intermetallic compound interface contacts the intermetallic compound interface.

13. The device of claim 1, wherein the silicon nitride or silicon carbonyl layer covering the intermetallic compound interface is the silicon carbonyl layer.

14. The device of claim 1 wherein: the intermetallic compound interface includes first and second copper-aluminum intermetallic layers.

15. The electronic device of claim 14, further including a polymeric mold layer on the silicon nitride or silicon carbonyl layer.

16. The electronic device of claim 14, wherein the bond pad is composed of aluminum or an aluminum alloy.

17. The electronic device of claim 14, wherein the silicon nitride or silicon carbonyl layer that covers the intermetallic compound interface contacts the intermetallic compound interface.

* * * * *